United States Patent [19]

Yoshida

[11] Patent Number: 4,543,647
[45] Date of Patent: Sep. 24, 1985

[54] ELECTRICALLY PROGRAMMABLE NON-VOLATILE SEMICONDUCTOR MEMORY DEVICE

[75] Inventor: Masanobu Yoshida, Kawaguchi, Japan

[73] Assignee: Fujitsu Limited, Kawasaki, Japan

[21] Appl. No.: 333,926

[22] Filed: Dec. 23, 1981

[30] Foreign Application Priority Data

Dec. 23, 1980 [JP] Japan .................. 55-182289
Dec. 23, 1980 [JP] Japan .................. 55-182294

[51] Int. Cl.$^4$ ............................................ G11C 11/40
[52] U.S. Cl. .................... 365/201; 365/226; 365/230
[58] Field of Search ............... 365/189, 200, 201, 218, 365/222, 226, 227, 230

[56] References Cited

U.S. PATENT DOCUMENTS

| | | | |
|---|---|---|---|
| 3,795,898 | 3/1974 | Mehta et al. | 365/230 |
| 3,969,706 | 7/1976 | Proebsting et al. | 365/230 |
| 4,094,012 | 6/1978 | Perlegos et al. | 365/226 |
| 4,336,603 | 6/1982 | Kotecha et al. | 365/182 |
| 4,342,103 | 7/1982 | Higuchi et al. | 365/201 X |

FOREIGN PATENT DOCUMENTS 2049202 12/1980 United Kingdom .

Primary Examiner—Joseph A. Popek
Attorney, Agent, or Firm—Staas & Halsey

[57] ABSTRACT

An electrically programmable non-volatile semiconductor memory device includes a plurality of word lines; a plurality of bit lines; and cell transistors, each having a control gate connected to the word line, a drain connected to the bit line, and a floating region for storing electrical charges therein are arranged at cross points of the word lines and the bit lines. An information "0" is written in the cell at the cross point by applying a high electric potential to both the selected word line and the selected bit line, and an information "1" is written in the cell by applying a high electric voltage to the word line and a low voltage to the bit line. For the purpose of testing whether or not the cell transistor is good, one control circuit or a plurality of additional control circuits can be used to simultaneously place all word lines and/or all bit lines in a selected state or in non-selected state.

11 Claims, 16 Drawing Figures

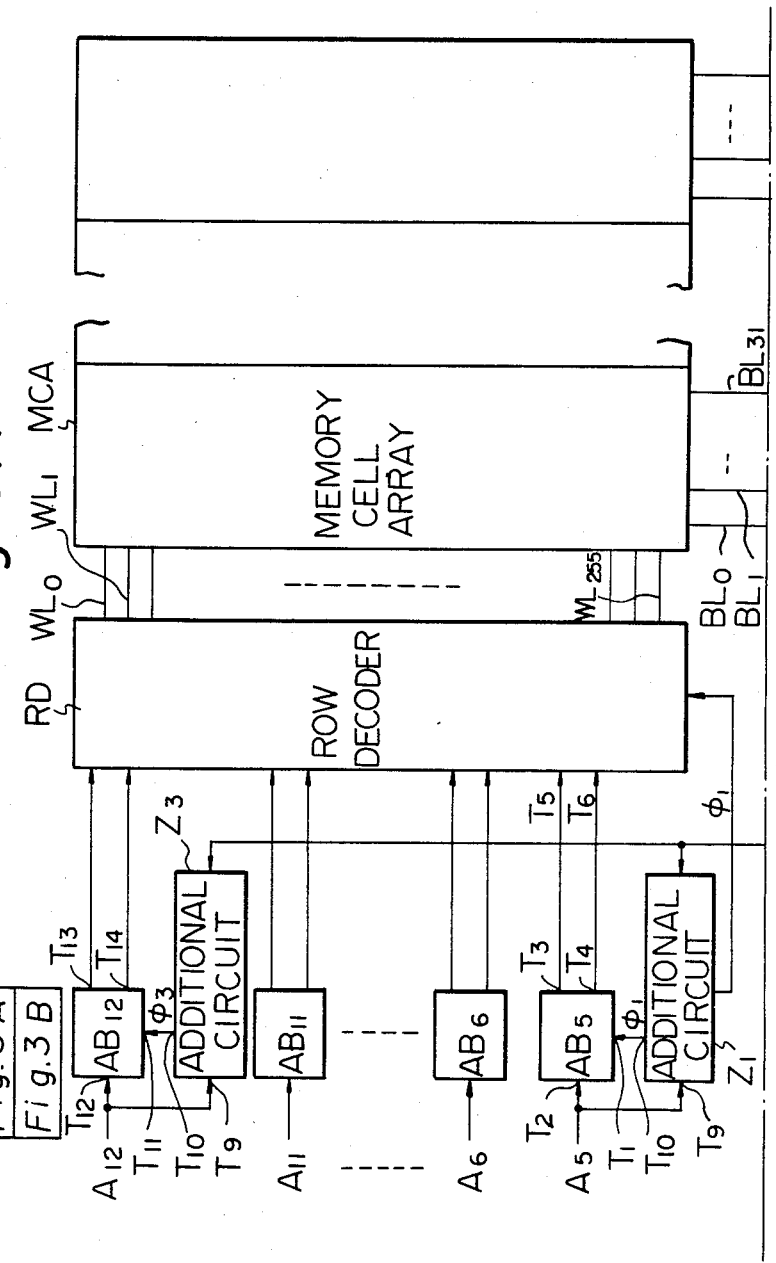

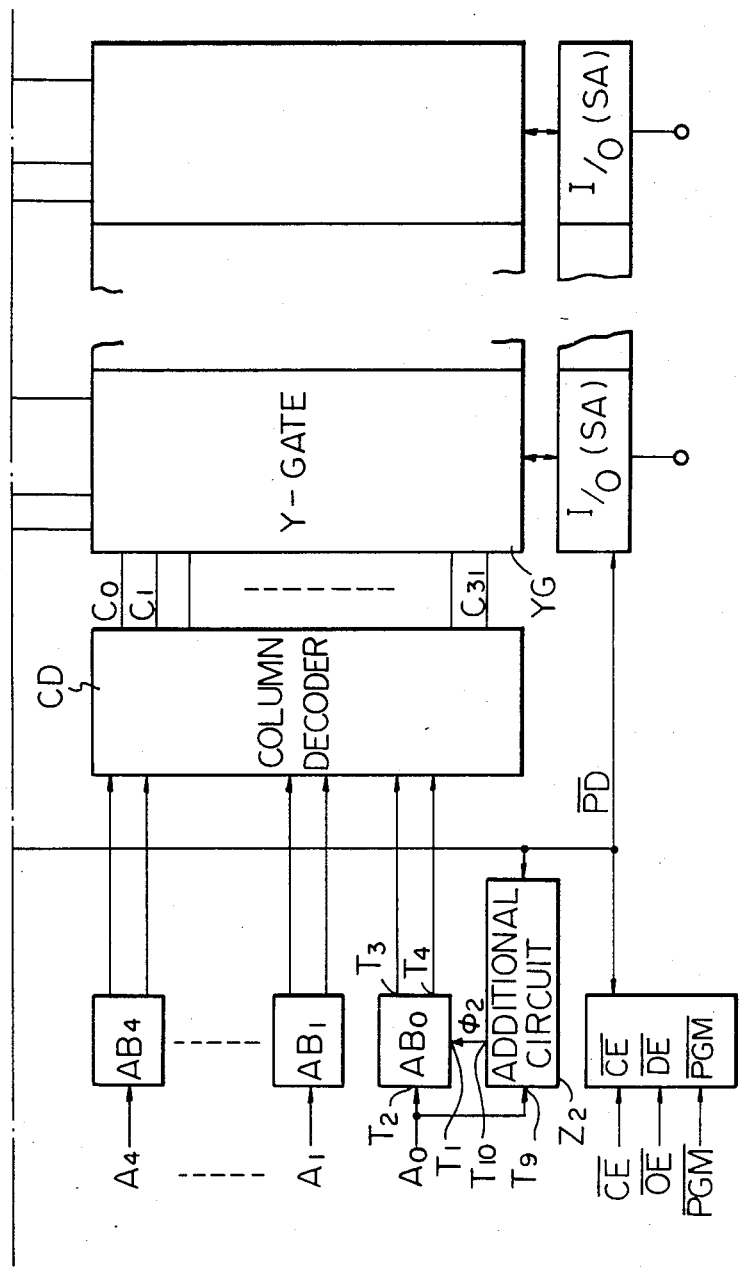

ELECTRICALLY PROGRAMMABLE NON-VOLATILE SEMICONDUCTOR MEMORY DEVICE

BACKGROUND OF THE INVENTION

The present invention relates to an electrically programmable non-volatile semiconductor memory device. More specifically, the present invention relates to a circuit structure for shortening the stress application time and the time for writing "0" in all the cells at the time of testing in an electrically programmable non-volatile semiconductor memory device.

In an electrically programmable non-volatile semiconductor memory device, such as an EPROM (Electrically programmable read only memory), a cell for one bit is formed by a source, a drain, a floating gate and a control gate. Ordinarily, the source is grounded, and the drain is connected to a bit line. Control gates for all the cells aligned in the row direction are integrated to become a word line, and this word line is selected when the control gates are maintained at a high potential. When a certain bit line is selected and the drain of the cell located at the crosspoint is maintained at a high potential, an information "0" is written therein and if the high potential is changed to a low potential, the information "1" is written therein. Incidentally, the information "0" corresponds to the state where charges are present on the floating gate, and the information "1" corresponds to the state where no charges are present on the floating gate. Further, the erase operation is carried out, so that the information "1" is written into all the cells (no charges are present on the floating gate), by applying an energy ray, such as an ultra-violet ray. The write operation is carried out by placing the bit line at a high level, and a charge is stored only when the information "1" is changed to the information "0". If the bit line is maintained at a low potential, no current flows in the channel; therefore, no electrical charges are injected. The relationship among the information "0" and "1", the potential (H and L) of the word line and the existance or non-existance of the charges is shown in the following table.

| Information | Word line | Bit line | Charge in the floating gate |
| --- | --- | --- | --- |
| "1" | H potential | L potential | non-existant |
| "0" | H potential | H potential | exists |

For example, if the cell array is formed with 64 K-bits (one block is formed by 8 K-bits), each cell is selected by using one of 256 word lines and one of 32 column decoder output lines. As mentioned hereafter, the column decoder output lines are used for selecting the bit lines. In this situation, each time one bit is selected in one block, the decoder outputs of the rows, as well as the columns, should be changed. This is carried out for the purpose of preventing multi-selection and this operation should be indispensable in the usual operation of this device.

In such an EPROM, at the time of writing in half-selected cells, undesirable phenomena, as described below, sometimes take place depending on the quality of the polycrystalline silicon comprising the floating gate FG or the quality of a peripheral insulating film. These undesirable phenomena will now be described with reference to FIG. 1.

UNDESIRABLE PHENOMENON 1

When the content of the first cell is "0", if information "1" or "0" is written in the second cell while the word line is maintained at a high potential, the potential of the control gate of the first cell simultaneously becomes high and, therefore, electrons in the floating gate of the first cell are moved (tunneled) to the control gate and the content of the first cell is reversed to "1".

UNDESIRABLE PHENOMENON 2

When the content of the first cell is "0", if information "0" is written in the second cell while maintaining the bit line of the first cell at a high potential, the drain of the first cell is maintained at a high potential, and therefore, electrons in the floating gate of the first cell are moved (by the tunnel effect) to the bit line and the content of the first cell is reversed to "1".

UNDESIRABLE PHENOMENON 3

When the content of the first cell is "1", if information "1" or "0" is written in the second cell while maintaining the word line of the first cell at a high potential, the potential of the control gate of the first cell becomes high, and, therefore, electrons are moved from the substrate to the floating gate of the first cell and the content of the first cell is reversed to "0".

As illustrated above, in the half-selected cell, the control gate is held at a high potential and the bit line wire is held at a low potential, or, the control gate is held at a low potential and the bit wire is held at a high potential, so that the half-selected cell receives an electrical stress. This is the reason that the content of the half-selected cell is changed.

Since the above-mentioned undesirable phenomena are not desirable in the operation of the EPROM, these phenomena should be removed.

The conventional test method and the time required for the testing using the conventional test method will now be described with reference to an EPROM Of 64 K-bits as an example.

UNDESIRABLE PHENOMENON 1

Information "0" is written in all the cells, and then information "1" is written in all the cells. That is, all cells are half-selected $|8\times K-1|$ times, so that the electrical stress is applied to the half-selected cell.

Test Time: 50 ms $\times$ 8 K-words = 409.6 s.

UNDESIRABLE PHENOMENON 2

Information "0" is written in all the cells, and then information "0" is written in all the cells. That is, all cells are half-selected $|8\times K-1|$ times, so that the electrical stress is applied to the half-selected cell.

Test Time: 50 ms $\times$ 8 K-words = 409.6 s.

UNDESIRABLE PHENOMENON 3

The information is erased in all the cells (the content is "1" in all the cells), and then information "1" is written in all the cells. That is, all cells are half-selected $|8\times K-1|$ times, so that the electrical stress is applied to the half-selected cell.

Test Time: 50 ms $\times$ 8 K-words = 409.6 s.

In the above-mentioned test method, for each word unit, that is, for each bit in every 8 K-bits defined by dividing 64 K-bits into 8 blocks, information "0" or "1" should be written during the test mode so that the electrical stress is applied to the half-selected cell

|8×K−1| times. Accordingly, if the writing time required for one bit is 50 ms, the time required for writing information "0" or "1" in all the bits of one block is 8×K times the time required for effecting the writing in one bit, that is, several minutes.

SUMMARY OF THE INVENTION

An object of the present invention is to provide an electrically programmable non-volatile semiconductor memory device in which, when the test is carried out in advance for checking the undesirable half-selection phenomena when using an EPROM, the time for writing the information "0" or "1" into all cells for the test is reduced.

Another object of the present invention is to provide an electrically programmable non-volatile semiconductor memory device in which, when the test is carried out in advance for checking the undesirable half-selection phenomena when using an EPROM, the time for applying the electrical stress by placing all cells in the half-selected state is reduced.

The above-mentioned objects can be achieved by an electrically programmable non-volatile semiconductor memory device which provides: a plurality of word lines; a plurality of bit wires; cell transistors having a control gate connected to the word line, a drain connected to the bit line and a floating region for storing electrical charges therein; and an additional control circuit for placing all word lines and/or all bit lines at the same time in a selected state or a non-selected state during testing.

Further features and advantages of the present invention will be apparent from the ensuing description with reference to the accompanying drawings to which, however, the scope of the invention is in no way limited.

BRIEF DESCRIPTION OF THE DRAWINGS

FIG. 3, including 3A and 3B, is a block diagram of the whole system of one embodiment of the EPROM of the present invention;

DESCRIPTION OF THE PREFERRED EMBODIMENTS

Figure 1A:
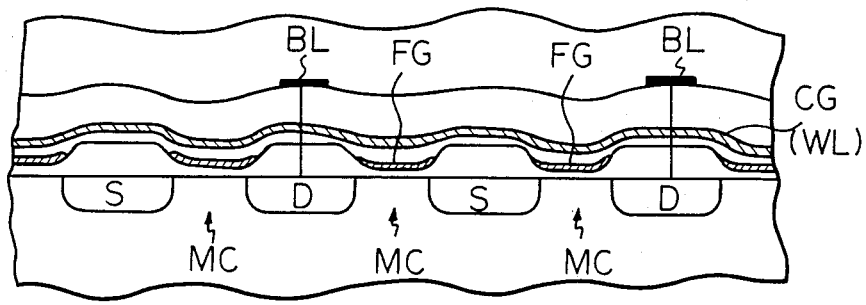
FIGS. 1A, 1B and 1C are sectional views of conventional memory cells for an EPROM and a circuit diagram thereof.
Figure 1B:
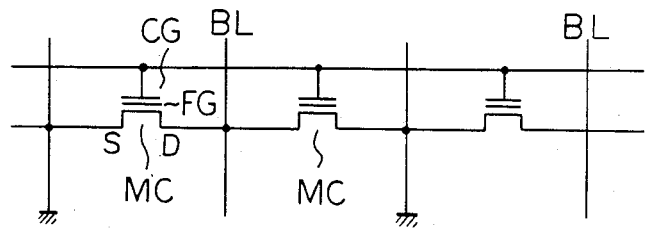
Figure 1C:
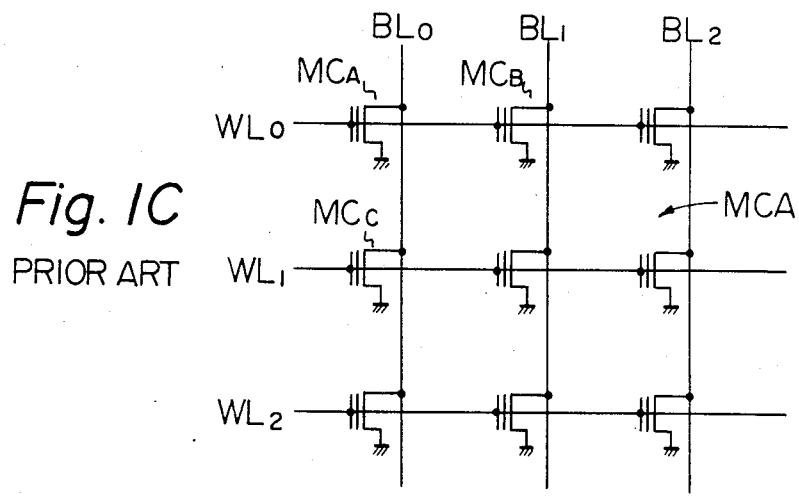

In an electrically programmable non-volatile semiconductor memory device, for example, an EPROM, as shown in FIG. 1A, a memory cell MC for one bit is constructed of a source S, a drain D, a floating gate FG and a control gate CG. Ordinarily, the source S is grounded and the drain D is connected to a bit line BL. Control gates CG for all the cells aligned in the row direction are integrated as a word line WL, and this word line is selected when the control gate CG is maintained at a high potential. When a certain bit line BL is then selected and the drain of the cell MC located at the crossing point is maintained at a high potential, information "0" is written and if the high potential is changed to a low potential, information "1" is written. Incidentally, the information "0" indicates the state where a charge is present on the floating gate and the information "1" indicates the absence of a charge. FIG. 1B shows an equivalent circuit for the cell shown in FIG. 1A. FIG. 1C shows a memory cell array MCA comprising a plurality of such cells $MC_A$, $MC_B$, $MC_C$, ... arranged in the form of a matrix, in which $BL_0$, $BL_1$, ... represent bit lines and $WL_0$, $WL_1$, ... represent word lines.

Figure 2:
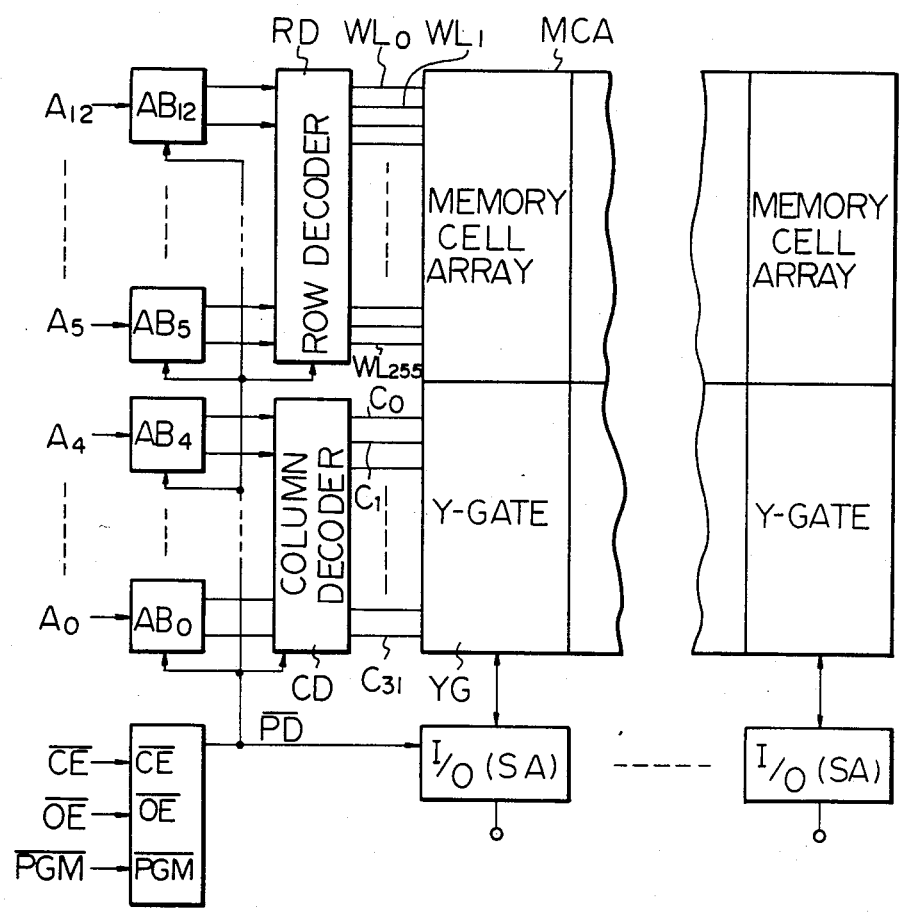
FIG. 2 is a block diagram of the whole system of the conventional EPROM.

FIG. 2 is a block diagram illustrating the entire structure of a conventional EPROM including peripheral circuits, in which $AB_0$ through $AB_{12}$ represent address buffers, RD represents a row decoder, CD represents a column decoder and YG represents a Y gate. In the case where the cell array MCA has 64 K-bits (each block including 8 K-bits), respective cells are selected by using 256 word lines $WL_0$ through $WL_{255}$ and 32 column decoder output lines $C_0$ through $C_{31}$. These column decoder output lines $C_0$, $C_1$, ... are used for the selection of the bit lines $BL_0$, $BL_1$, .... In order to select one bit in one block of the cell array MCA, it is necessary to change both the row and column decoder outputs every time one bit is selected. In the normal operation state, this is indispensable so as to prevent multiple selection.

Further, the conventional EPROM is constructed so that, when the whole memory device is non-selected, the whole device is placed in a power down mode by applying a power down signal to the circuits, including the address buffer AB, the row decoder RD, and the sense amplifiers SA, in which the electrical power is dissipated.

In the EPROM shown in FIG. 2, as already mentioned, the electrical stress is applied to the half-selected cells at the time of writing, and the undesirable phenomena, as described below, takes place, depending on the quality of the polycrystalline silicon comprising the floating gate FG or the quality of the peripheral insulating film. These undesirable phenomena will now be described with reference to FIGS. 1A, 1B and 1C.

UNDESIRABLE PHENOMENON 1

When the content of the cell $MC_A$ is "0", if information "1" or "0" is written in the cell $MC_B$ while the word line $WL_1$ is maintained at a high potential, the potential of the control gate CG of the cell $MC_A$ simultaneously becomes high ($V_{ss}$ at the drain D), and, therefore, electrons in the floating gate FG of the cell $MC_A$ are moved (by the tunnel effect) to the control gate CG and the content of the cell $MC_A$ is reversed to "1".

UNDESIRABLE PHENOMENON 2

When the content of the cell $MC_A$ is "0", if information "0" is written in the cell $MC_C$ while maintaining both the word line $WL_1$ and the bit line $BL_0$ at a high level, the drain D of the cell $MC_A$ is also maintained at a high level ($V_{ss}$ at the word line $WL_0$ at this time), and, therefore, electrons in the floating gate FG of the cell $MC_A$ are moved (by the tunnel effect) to the bit line $BL_0$ and the content of the cell $MC_A$ is reversed to "1".

UNDESIRABLE PHENOMENON 3

When the content of the cell $MC_A$ is "1", if information "1" or "0" is written in the cell $MC_B$ while maintaining the word line $WL_1$ at a high potential, the potential of the control gate CG of the cell $MC_A$ becomes high ($V_{ss}$ at the drain D), and, therefore, electrons are moved (by the tunnel effect) from the substrate to the floating gate of the cell $MC_A$ and the content of the cell $MC_A$ is reversed to "0".

Since the above-mentioned undesirable phenomena are not desirable during the operation of the EPROM, these phenomena should be removed.

The conventional test method and the time required for the testing using the present invention will now be described with reference to an EPROM of 64 K-bits as an example.

FIG. 3 is a block diagram illustrating one embodiment in which the present invention is applied to an EPROM of 64 K-bits. The same members and elements as shown in FIG. 2 are represented by the same symbols as used in FIG. 2.

In the EPROM of this embodiment, by provisions of additional control circuits $Z_1$ through $Z_3$, the following tests become possible.

UNDESIRABLE PHENOMENON 1

Information "0" is written in all the cells, and then all the word lines are maintained at a high potential and all the bit lines are maintained at a low potential L ($V_{ss}$). That is, the electrical stress is applied to all cells by placing all cells in a half-selected state where the word lines (control gates) are placed at a high potential and the bit lines (drains) are placed at a low potential.

Test Time:

$$50 \text{ ms} \times 32 \text{ cycles} = 1.6 \text{ s}$$

UNDESIRABLE PHENOMENON 2

Information "0" is written in all the cells, and then all the word lines are maintained at a low potential L ($V_{ss}$) and all the bit lines are maintained at a high potential. That is, the electrical stress is applied to all cells by placing all cells in a half-selected state where the word lines (control gates) are placed at a low potential and the bit lines (drain) are placed at a high potential.

Test Time:

$$50 \text{ ms} \times 256 \text{ cycles} = 12.8 \text{ s}$$

UNDESIRABLE PHENOMENON 3

The information is erased in all the cells (the content is "1" in all the cells), and then all the word lines are maintained at a high potential and all the bit lines are maintained at a low potential L ($V_{ss}$). That is, the electrical stress is applied to all cells by placing all cells in a half-selected state, the same as in undesirable phenomena 1 above.

Test Time:

$$50 \text{ ms} \times 32 \text{ cycles} = 1.6 \text{ s}$$

In the above-mentioned test method, in connection with all the word lines, it is sufficient if they are selected (maintained at a high potential) or non-selected (maintained at a low potential $V_{ss}$), and in connection with all the bit lines, it is sufficient if selection of a high potential or a low potential $V_{ss}$ is made. Here, it is noted that, in connection with the word lines, the term "selection" means to place at a high potential and the term "non-selection" means to place at a low potential, and in connection with the bit lines, the term "selection" means to place in an active state by placing the bit lines at a high or a low potential and the term "non-selection" means to place in a non-active state by placing the bit lines, for example, at a floating state. Accordingly, in connection with, for example, the undesirable phenomenon 1, if all the word lines are maintained at a high potential (selection) and all the bit lines are maintained at $V_{ss}$ (non-selection), information "1" can be written in all the cells as in the conventional test method. The time required for this operation is 50 ms. However, in this case, the cell connected to one word line, for example, the cell $MC_A$ shown in FIG. 1C, receives only a stress corresponding to 1/32 of the stress under which writing is effected on the other cells of the same word line (since there are 32 bit lines), and, therefore, this stress is not comparable to the stress given to the cell $MC_A$ in the conventional test method. More specifically, the stress to be applied when writing is effected on the cells $MC_B$, ... of the remaining 31 bit lines is not applied to the cell $MC_A$. Therefore, in connection with the undesirable phenomena 1 and 3, the required time is multiplied by 32 (cycles). Even if the required time is thus multiplied, the test time is only 1.6 seconds and, therefore, the test time is much shorter than the test time required in the conventional test method. In connection with the undesirable phenomena 1 and 3, since there are 32 bit lines $BL_0$ through $BL_{31}$ to be selected, the required time is multiplied by 32 cycles. However, in the case of the undesirable phenomenon 2, since there are 256 word lines $WL_0$ through $WL_{255}$ to be selected, the required time should be multiplied by 256 cycles. Even if the required time is thus multiplied, the total test time is as short as 12.8 seconds.

In a memory device of this type, in order to avoid multiple selection, it is indispensable that each output of the row decoder RD and the output of the column decoder CD should have only one selection level. The first additional control circuit $Z_1$, which is additionally disposed in the present invention, simultaneously maintains all the word lines $WL_0$ through $WL_{255}$ at the selection level (high potential). The second additional control circuit $Z_2$ simultaneously maintains the output lines $C_0$ through $C_{31}$ of the column decoder CD at the selection level at the test time (it depends on the input data whether all the bit lines are maintained at a high potential or the low potential $V_{ss}$). The third additional control circuit $Z_3$ simultaneously maintains all the word lines $WL_0$ through $WL_{255}$ at the non-selection level ($V_{ss}$) at the test time. Accordingly, in connection with the undesirable phenomena 1 and 3, testing is performed by using the additional control circuits $Z_1$ and $Z_2$, and in connection with the undesirable phenomenon 2, testing is performed by using the additional control circuits $Z_2$ and $Z_3$.

Figure 4:
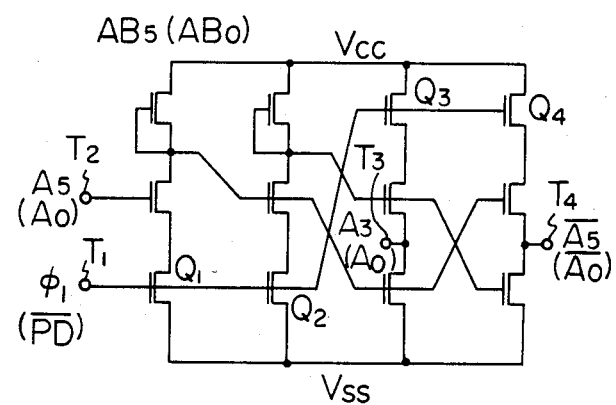
FIG. 4 is an address buffer of FIG. 3.

The additional control circuit $Z_1$ for selection of all the word lines is added to an address buffer $AB_5$. This address buffer $AB_5$ is of the power-down type, in which, as shown in FIG. 4, by applying a power-down signal $\overline{PD}$ (see FIG. 2) to a terminal $T_1$ for maintaining the address buffer $AB_5$ at a low potential (L) at the time of power-down, transistors $Q_1$ through $Q_4$ are turned off to save power consumption. An address $A_5$ is supplied to a terminal $T_2$ from the outside, and in the case of an active mode, where the signal $\overline{PD}$ is at a high potential (H), the terminal $T_1$ is maintained at a high potential (H) and the transistors $Q_1$ through $Q_4$ are turned on, with the result that the address $A_5$ and reversed address signal $\overline{A_5}$ appear on output terminals $T_3$ and $T_4$. During a power-down mode, the signal $\overline{PD}$ is at a low potential (L) and the terminal $T_1$ is maintained at a low potential (L), and, as described hereinbefore, the transistors $Q_1$ through $Q_4$ are turned off, with the result that the terminals $T_3$ and $T_4$, and, hence, the signals $A_5$ and $\overline{A_5}$, are at the low potential (L).

Figure 5:
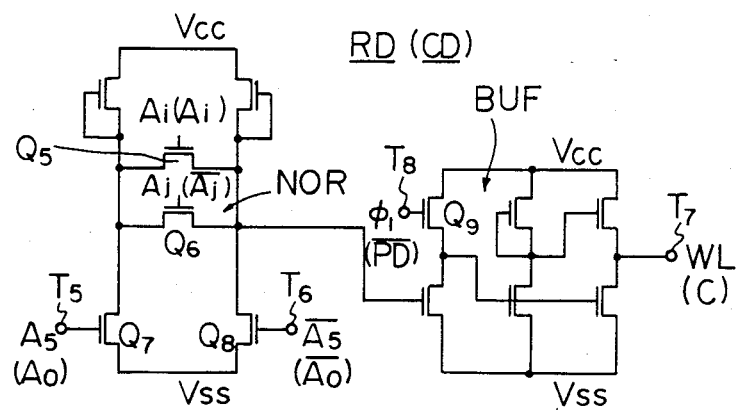
FIG. 5 is part of a row decoder or column decoder of FIG. 3.

FIG. 5 illustrates the portion of the row decoder RD, which selects one word line. This portion comprises a nor gate NOR and an output buffer BUF. In all of the nor gates NOR, the signals $A_5$ and $\overline{A_5}$ are applied to terminals $T_5$ and $T_6$. In the respective nor gates NOR, the signals which are applied to transistors $Q_5$ and $Q_6$ are different. In the embodiment shown in FIG. 5, when the potentials of $A_i$, $A_j$ and $A_5$ are low (L), transistors $Q_5$, $Q_6$ and $Q_8$ are turned off and the output of the nor gate NOR becomes high (H). Under other input conditions, the transistor $Q_8$ is turned on or the transistor $Q_7$ and at least one of the transistors $Q_5$ and $Q_6$ are turned on, and the output of the nor gate NOR becomes low (L). The time when the output of the nor gate NOR is at a high level (H) is the time of selection, and at this time, the output terminal $T_7$ of the output buffer BUF is maintained at a high potential (H) and the corresponding word line WL is selected. However, if the output of the nor gate NOR is at a low potential (L), the level of the output terminal $T_7$ of the buffer BUF is also low (L). Incidentally, the signal $\overline{PD}$ is applied to the terminal $T_8$, and, in the active mode, the inverter load $Q_9$ of the input stage of the buffer BUF is turned on and, in the power-down mode, this inverter load $Q_9$ is turned off.

Figure 6:
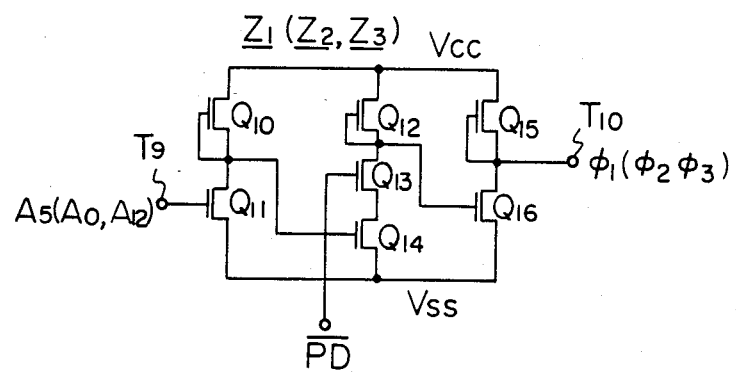
FIG. 6 is an additional control circuit of the present invention as shown in FIG. 3.

In the present embodiment, the additional control circuit $Z_1$ produces a signal $\phi_1$ which is low (L), even at the time of the test, and this signal is applied to the terminal $T_1$ in FIG. 4 and the terminal $T_8$ in FIG. 5. An example of this circuit is shown in FIG. 6. Control circuit $Z_1$ comprises three stages of inverters, and the driver $Q_{11}$ of the first inverter stage ($Q_{10}$ and $Q_{11}$) is kept off at an ordinary TTL level and it is turned on for the first time when a high voltage (for example, 18 V) is applied to the terminal $T_9$. This terminal $T_9$ is a terminal in which the address $A_5$ is received from the outside, but this terminal $T_9$ is meaningless when the address $A_5$ of an ordinary TTL level is applied to the transistor $Q_{11}$. Drivers of the second inverter stage ($Q_{12}$ through $Q_{14}$) are transistors $Q_{13}$ and $Q_{14}$ of the "and" condition, and the transistor $Q_{14}$ is controlled by the output of the first inverter stage and the transistor $Q_{13}$ is controlled by the signal $\overline{PD}$. The output inverter stage ($Q_{15}$ and $Q_{16}$) produces the signal $\phi_1$ which is sent to the terminal $T_{10}$.

In the above-mentioned additional control circuit $Z_1$, when a high voltage for the selection of all the word lines is applied to the terminal $T_9$ from the outside (at the time of the test), the transistor $Q_{11}$ is turned on, the transistor $Q_{14}$ is turned off and the transistor $Q_{16}$ is turned on, with the result that the potential of the signal $\phi_1$ becomes low (L). When the potential of the signal $\phi_1$ becomes low (L), the potential of the terminal $T_1$ in FIG. 4 becomes low (L), and therefore, the transistors $Q_1$ through $Q_4$ are turned off and the potentials of the terminals $T_3$ and $T_4$ become low (L), with the result that the potentials of the terminals $T_5$ and $T_6$ (FIG. 5) become low (L), and hence, the potential of the terminal $T_7$ becomes high (H). Incidentally, the potential of the terminal $T_8$ also simultaneously becomes low (L) to ensure the high potential (H) at the terminal $T_7$. What is important is that when the potential of the signal $\phi_1$ is low (L), the potentials of the terminals $T_5$ and $T_6$ become low (L). As pointed out hereinbefore, $A_5$ and $\overline{A_5}$ are used for all the word lines. Accordingly, if the potential of the signal $\phi_1$ becomes low (L), all the word lines $WL_0$ through $WL_{255}$ are maintained at the selection level. In the additional control circuit $Z_1$, even if the potential of the signal $\overline{PD}$ is low (L), the potential of the signal $\phi_1$ is low (L). This is for the purpose of realizing the power-down mode. In an EPROM, ordinarily, the majority of the electric current is consumed by the decoders. Accordingly, if at the time of selection all the codes the decoder are in the same state as that at the time of powder-down, as described hereinbefore, the power source current is reduced, and there is an advantage in that this operation can easily be confirmed. In the case of the active mode, since each of the transistors $Q_{13}$ and $Q_{14}$ is turned on, the potential of the signal $\phi_1$ becomes high (H) and $A_5$ is not equal to $\overline{A_5}$ in the output of the address buffer $AB_5$. Therefore, the terminal $T_7$ in FIG. 5 is maintained at the potential for selection or the potential for non-selection according to the input condition of the nor gate NOR.

Since the second additional control circuit $Z_2$ is for selection of all the columns, the same structure as described above is adopted in connection with the address $A_0$ commonly used in the column decoders. Namely, if $A_5$ and $\overline{A_5}$ in FIG. 4 are replaced by $A_0$ and $\overline{A_0}$, the structure of the address buffer $AB_0$ is realized, and if $A_5$ and $\overline{A_5}$ in FIG. 5 are replaced by $A_0$ and $\overline{A_0}$, the column decoder is realized and the terminal $T_7$ is one of $C_0$ through $C_{31}$. Furthermore, if the terminal $T_9$ is used as the input terminal of the address $A_0$ in FIG. 6, there is constructed a second additional control circuit $Z_2$ in which a signal $\phi_2$ is obtained from the terminal $T_{10}$. In this control circuit $Z_2$, at the time of the test, a high voltage for selection of all the columns is applied to the terminal $T_9$, and the output $\phi_2$ is maintained at a low potential (L). Accordingly, both the signals $A_0$ and $\overline{A_0}$ become low (L) and hence, all the output lines $C_0$ through $C_{31}$ are simultaneously maintained at a high level (H) and all the bit lines $BL_0$ through $BL_{31}$ are simultaneously selected. As described hereinbefore, it depends on the data input whether the selected bit lines are maintained at a high potential or low potential $V_{ss}$.

Figure 7:
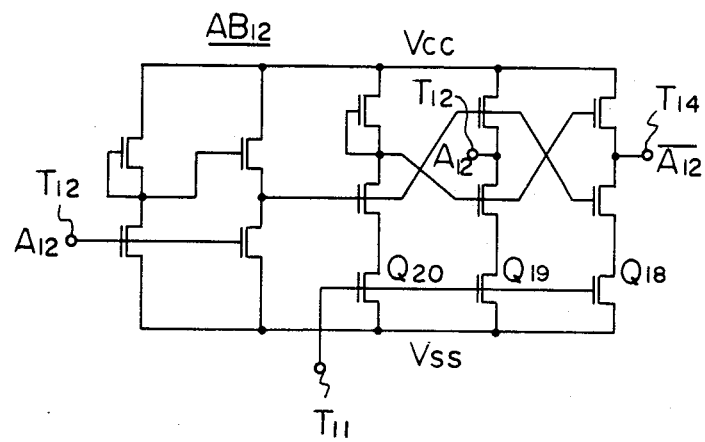
FIG. 7 is a circuit diagram of another address buffer of FIG. 3.

The third additional control circuit $Z_3$ is a circuit for simultaneous non-selection of all the word lines $WL_0$ through $WL_{255}$. The idea of non-selection of all the word lines is contrary to the idea of selection of all the word lines. Accordingly, among the addresses used for the respective word lines of the row decoder RD, one address which provides a low potential (L) for the output terminal $T_7$ (see FIG. 5) when said address is at a high potential (H) is noted. This address is $A_{12}$, and $A_{12}$ or $\overline{A_{12}}$ is applied to the transistors $Q_5$, $Q_6$, ... of the nor gate NOR shown in FIG. 5. Accordingly, as shown in FIG. 7, power-down transistors $Q_{18}$ through $Q_{20}$ of the address buffer $AB_{12}$ are arranged on the low potential side in contrast to the circuit shown in FIG. 4, so that when the terminal $T_{11}$ is maintained at a low potential (L), the power-down mode is realized. The terminal $T_9$ shown in FIG. 6 is used as the exterior input terminal of the address $A_{12}$, and, at the time of the test, a high voltage for non-selection of all the word lines is applied to this terminal $T_9$. Thus, there is fabricated a third additional control circuit $Z_3$ in which an output $\phi_3$ of a low potential (L), which simultaneously maintains $A_{12}$ and $\overline{A_{12}}$ at a high level (H) in FIG. 7, is obtained from the terminal $T_{10}$.

In the conventional EPROM (FIG. 2) in the power-down mode, the power down signal is supplied to the decoders RD, CD and also to the input/output portion I/O, whereas, in the present invention, no power down signal is applied to the input/output portion I/O and the operation, which is the same as that in the active time, is carried out.

As is apparent from the foregoing description, it is sufficient if, for example, a structure shown in FIG. 6 is given to the additional control circuits $Z_1$ through $Z_3$ to be added according to the present invention. Therefore, elements to be added are very simple, and the present invention is advantageous in that the test time can be remarkably shortened by the addition of such simple elements.

Figure 8:
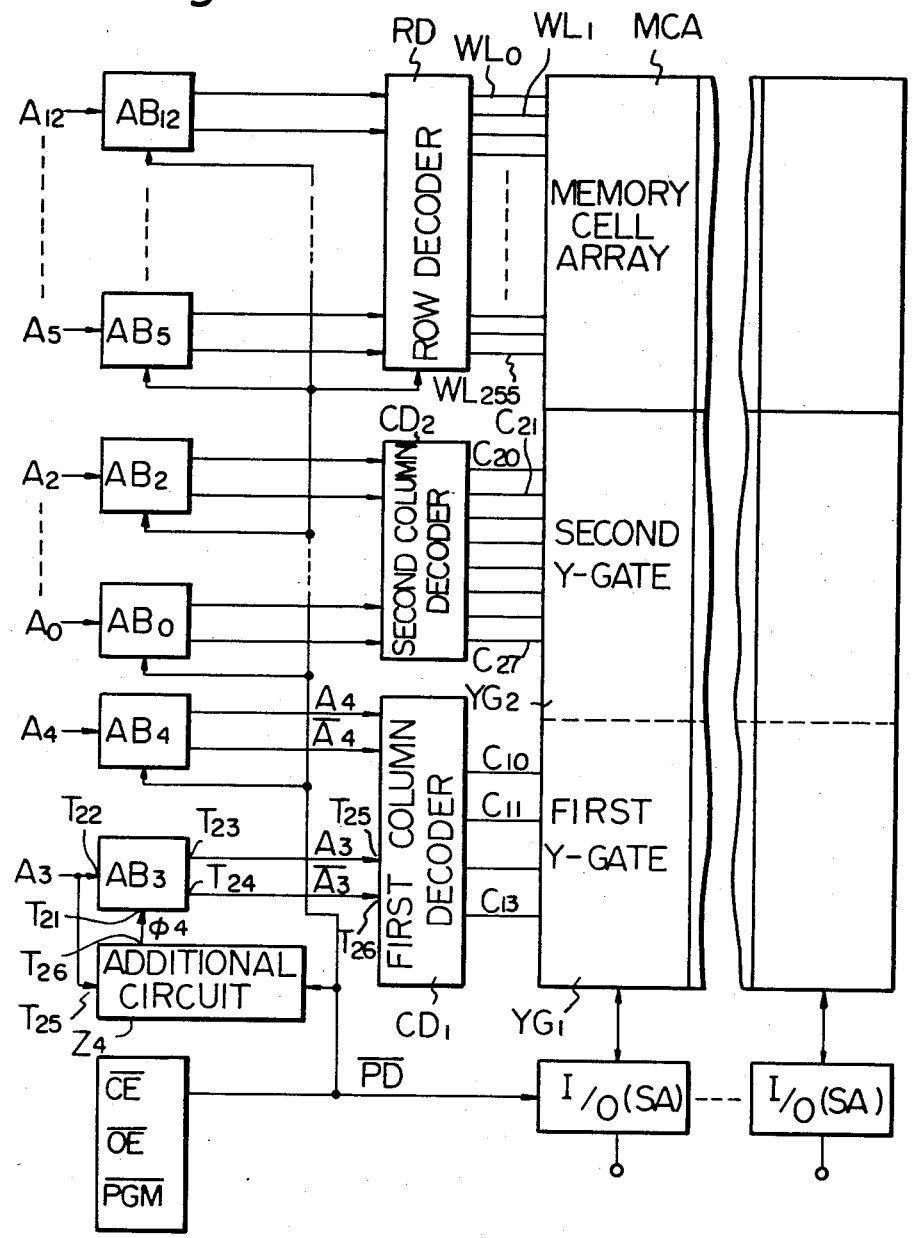
FIG. 8 is a block diagram of another embodiment of the present invention.

FIG. 8 is a block diagram illustrating one embodiment of the present invention, in which column selection is simultaneously effected in N bit lines so as to write the information "0". Memory cells are divided into a plurality of blocks, that is, cells arrays MCA, with each cell array including 32 bit lines. It is preferable that all the 32 bit lines be simultaneously selected. However, in the present embodiment, N is adjusted to 4 while the current capacitance of the writing lines and the mutual conductance gm of the transistor are taken into account. This embodiment is in agreement with the conventional EPROM shown in FIG. 2 in that the 256 word lines are selected by 8 bit of address inputs $A_5$ through $A_{12}$ among the address inputs $A_0$ through $A_{12}$. Among the remaining 5 bits, $A_0$, $A_1$ and $A_2$ are used for a second column decoder $CD_2$, and $A_3$ and $A_4$ are used for a first column decoder $CD_1$. $Z_4$ represents an additional control circuit for maintaining all the output lines $C_{10}$ to $C_{13}$ of the first column decoder $CD_1$ at a high potential (H) at the test time and simultaneously selecting cells for 4 bits. In the present embodiment, this circuit $Z_4$ is added to an address buffer $AB_3$.

Figure 9:
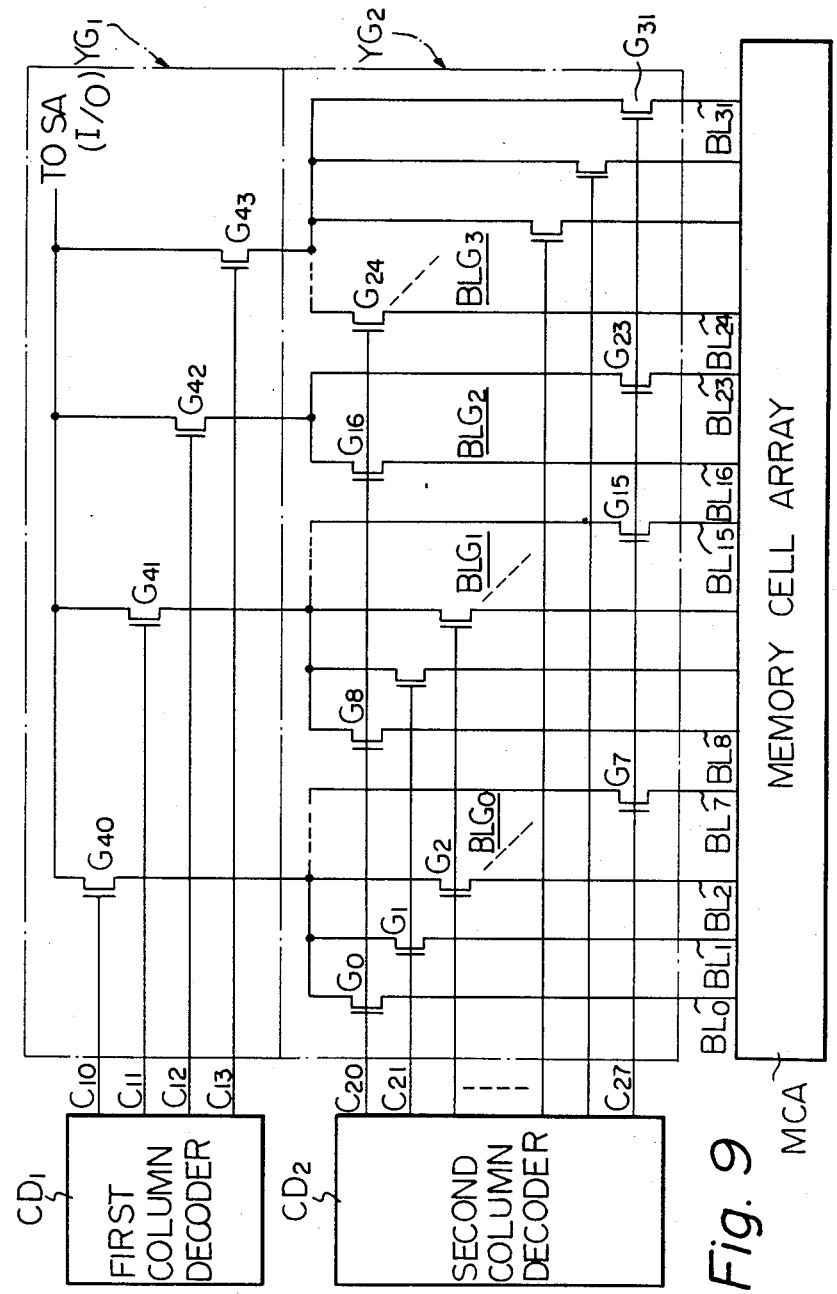
FIG. 9 is a detailed circuit of the column selection gate of FIG. 8.

As shown in FIG. 9, 32 bit lines $BL_0$ through $BL_{31}$ are divided into 4 bit line groups $BLG_0$ through $BLG_3$, each group including M bit lines (M is equal to 8 in the present embodiment), and second column selecting gates $G_0$ through $G_{31}$ are inserted in the bit lines, respectively. A second Y gate $YG_2$ is constructed of gates $G_0$ through $G_{31}$. First column selecting gates $G_{40}$ through $G_{43}$ are disposed for the bit line groups $BLG_0$ through $BLG_3$, and a first Y gate $YG_1$ is constructed of first column selecting gates $G_{40}$ through $G_{43}$. Incidentally, one end of each of the gates $G_{40}$ through $G_{43}$ is commonly connected to a sense amplifier SA, also acting as a data input buffer. The first column decoder $CD_1$ has 4 output lines $C_{10}$ through $C_{13}$, and the gates $G_{40}$ through $G_{43}$ are individually or simultaneously selected by these output lines $C_{10}$ through $C_{13}$. The second column decoder $CD_2$ has 8 output lines $C_{20}$ through $C_{27}$, and one gate for each of the bit line groups $BLG_0$ through $BLG_3$ and thus four gates as a whole with respect to one block of the MCA are selected simultaneously by output lines $C_{20}$ through $C_{27}$. For example, when the potential of the output line $C_{20}$ becomes high (H), the gates $G_0$, $G_8$, ..., $G_{24}$ corresponding to the bit lines $BL_0$, $BL_8$, ..., $BL_{24}$ are simultaneously turned on.

During normal operation only one of the output lines $C_{20}$ through $C_{27}$ of the second column decoder $CD_2$ can be maintained at a high potential (H). However, at the time of the test, four of the output lines $C_{10}$ through $C_{13}$ can be simultaneously maintained at a high potential (H) by the additional control circuit $Z_4$, though in the normal operation, only one of these output lines can be maintained at a high potential (H). This feature will now be described with reference to FIGS. 10 through 12.

Figure 10:
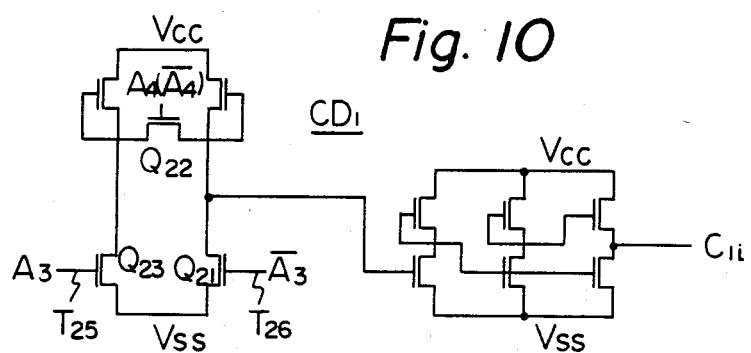
FIG. 10 is part of a first column decoder of FIG. 8.

FIG. 10 illustrates the structure of one output line $C_{1i}$ ($i=0-3$) of the first column decoder $CD_1$. The column decoder $CD_1$ as a whole receives outputs $A_3$, $\overline{A_3}$, $A_4$ and $\overline{A_4}$ of address buffers $AB_3$ and $AB_4$, and ordinarily, one of the output lines $C_{10}$ through $C_{13}$ is maintained at a high potential (H) by one of the four combinations of the two bits. In the embodiment illustrated in FIG. 10, when the signals $\overline{A_3}$ and $A_4$ are at a low potential (L), both the transistors $Q_{21}$ and $Q_{22}$ are turned off and the output line $C_{1i}$ is selected (maintained at a high potential). The other three output lines are selected by appropriately combining the operation of turning on the transistor $Q_{23}$ by maintaining the signal $A_3$ at a low potential (L) and the operation of turning off the transistor $Q_{22}$ by maintaining the signal $\overline{A_4}$ at a low potential (L). What is common in these four operations is that the transistors $Q_{23}$ and $Q_{21}$ are turned on and off by the signals $A_3$ and $\overline{A_3}$. These signals $A_3$ and $\overline{A_3}$ are produced by an address buffer $AB_3$ shown in FIG. 11.

Figure 11:
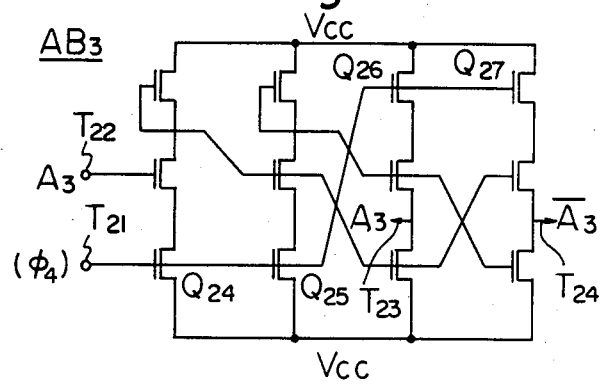
FIG. 11 is a detailed circuit of an address buffer of FIG. 8.

The address buffer $AB_3$ shown in FIG. 11 is of the power-down type, in which, by applying a power-down signal $\overline{PD}$ of a low potential (L) to a terminal $T_{21}$, transistors $Q_{24}$ through $Q_{27}$ and transistors $Q_{21}$, $Q_{22}$ and $Q_{23}$ shown in FIG. 10, are turned off to save power consumption. In the embodiment shown in FIG. 2, this signal $\overline{PD}$ is applied to all of the address buffers $AB_0$ through $AB_{12}$, but in the embodiment shown in FIG. 10, the signal $\overline{PD}$ is applied only to the address buffers $AB_0$ through $AB_2$ and $AB_4$ through $AB_{12}$, while a signal $\phi_4$ from the additional circuit $Z_4$ shown in FIG. 12 is applied to the terminal $T_{21}$ of the address buffer $AB_3$.

The additional circuit $Z_4$ comprises three stages of inverters. The first inverter stage comprises a transistor $Q_{30}$ as the load and a transistor $Q_{31}$ as the driver. The second inverter stage comprises a transistor $Q_{32}$ as the load and transistors $Q_{33}$ and $Q_{34}$ connected in series, which act as a driver under "and" conditions. The output inverter stage comprises a transistor $Q_{35}$ as the load and a transistor $Q_{36}$ as the driver. The signal $\phi_4$ is at a high potential (H) in the active mode to turn on the transistors $Q_{24}$ through $Q_{27}$ shown in FIG. 11. Namely, in the active mode, the signal $\overline{PD}$ is at a high potential (H) and the transistor $Q_{31}$ is arranged so that it is not turned on by the ordinary input $A_3$, whereby both the transistors $Q_{33}$ and $Q_{34}$ are kept in the "on" state. In the power-down mode, the transistor $Q_{33}$ is turned off by maintaining the signal $\overline{PD}$ at a low level (L) and a high voltage is applied to the terminal $T_{25}$ from the outside at the time of the test, whereby the transistor $Q_{31}$ is turned on and the transistor $Q_{34}$ is turned off to change the level of the signal $\phi_4$ to a low potential (L). The terminal $T_{25}$ is significant to the additional circuit $Z_4$ only when a high voltage is applied to terminal $T_{25}$. In the present embodiment, since this terminal is used commonly as the input of the address $A_3$, ordinary signals $A_3$ of a high or low potential (H or L) of a TTL potential are supplied to the terminal $T_{25}$ in the active mode. However, this is not significant to the additional circuit $Z_4$.

When the potential of the signal $\phi_4$ becomes low (L), the potential of the terminal $T_{21}$ shown in FIG. 11 becomes low (L) and the transistors $Q_{24}$ through $Q_{27}$ shown in FIG. 11 are turned off, and, therefore, the potentials of both the outputs $A_3$ and $\overline{A_3}$ become low (L), with the result that both the transistors $Q_{21}$ and $Q_{23}$ shown in FIG. 10 are turned off and the potentials of the output lines $C_{1i}$, that is, $C_{10}$ through $C_{13}$, become high (H). Since all the gates $G_{40}$ through $G_{43}$ shown in FIG. 9 are turned on if the output lines $C_{10}$ through $C_{13}$ are at a high level (H), for example, when the output line $C_{20}$ of the second column decoder $CD_2$ is at a high potential (H), the gates $G_0$, $G_8$, ... $G_{24}$ are turned on, and therefore, the bit lines $BL_0$, $BL_8$, ... $BL_{31}$ are simultaneously selected. Accordingly, if the output line $R_0$ of the row decoder shown in FIG. 8 is at a selection level, information "0" is simultaneously written in cells of the 4 bits present at the points where the word line $WL_0$ crosses the bit lines $BL_0$, $BL_8$, ... $BL_{31}$ (at this time, the bit lines are maintained at a high potential). A similar operation is carried out in the other blocks, and the information "0" is written in 32 bit lines of the memory device (that is, 4 bits×8 blocks).

Figure 12:
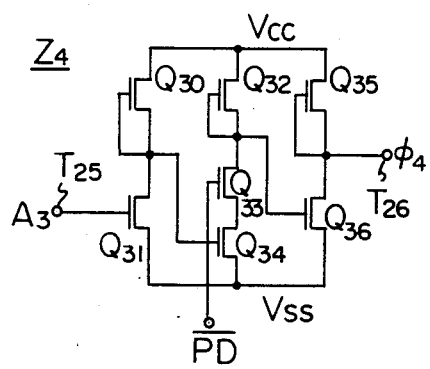
FIG. 12 is a detailed circuit of an additional control circuit of FIG. 8.

Incidentally, in the active mode, the signal $\phi_4$ is at a high potential (H) in FIG. 12, and the relation $A_3 \neq \overline{A_3}$ is established in FIG. 11. Accordingly, any one of the output lines $C_{10}$ through $C_{13}$ of the first column decoder $CD_1$ is maintained at a high potential (H). Therfore, for example, if the output line $C_{10}$ is at a high potential (H) and the output line $C_{20}$ is at a high potential (H), the gates $G_{40}$ and $G_0$ are turned on and only the bit line $BL_0$ is selected. In short, although the gates $G_8$, ... $G_{24}$ are simultaneously turned on, since the gates $G_{41}$ through $G_{43}$ are kept in the "off" state, multiple selection of the bit lines $BL_8$, ... $BL_{24}$ is prevented.

Figure 13:
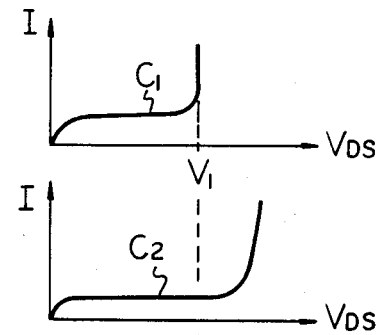
FIG. 13 is a voltage/current graph for word lines that are multi-selected in the circuit shown in FIG. 8.

Multiple selection of word lines may be considered for the method of writing information simultaneously in a plurality of bits. This method, however, is defective in the following point. Namely, there is present a difference in the characteristic between cells $MC_A$ and $MC_B$ connected to one bit line, as shown in FIG. 13, and in the case where the voltage $V_{ds}$ between the drain and source in the cell $MC_A$ is as low as $V_1$, the bit line is clamped to this voltage, and information "0" cannot be written into the cell $MC_B$. Accordingly, even if the cell $MC_B$ is normal, it is erroneously judged as being not good. Incidentally, in FIG. 13, $C_1$ is a curve showing the I-V characteristic of the cell $MC_A$ and $C_2$ is a curve showing the I-V characteristic of the cell $MC_B$. However, if the multiple selection of bit lines is performed according to the present invention, such a disadvantage is not brought about at all.

As will be apparent from the foregoing description, according to the present invention, the time required for writing information "0" in all the cells can advantageously be shortened at the time of testing an electrically programable semiconductor memory device, such as an EPROM. Incidentally, if simultaneous writing is effected on 4 bits in an EPROM of 64 K-bits, according to the present invention, the writing time can be reduced to ¼ of the time required in the conventional technique, that is, 102.4 seconds.

In the above-mentioned embodiment, the explanation is given for the case where 4 bit lines per one block are simultaneously selected; however, of course a case where, for example, 8 bit lines or all 32 bit lines are simultaneously selected is also included in the present invention.

I claim:

1. An electrically programmable non-volatile semiconductor memory device, comprising:
    a plurality of word lines;
    a plurality of bit lines;
    a decoder operatively connected to said word lines and/or said bit lines;
    cell transistors each having a control gate connected to one of said word lines, a drain connected to one of said bit lines, a source connected to one of a voltage terminal and a floating gate for storing an electric charge therein;
    an input circuit having an active state and a power down mode, and operatively connected to said bit lines for inputting a write signal to the cell transistors;
    at least one control circuit, operatively connected to said decoder, for placing at a test time, all of said word lines and/or all of said bit lines in a selected state at the same time and said input circuit in the active state; and
    power down means, operatively connected to said decoder and said input circuit, for placing said decoder and said input circuit in the power down mode at a power down time.

2. An electrically programmable non-volatile semiconductor memory device, comprising:
    a first group of address buffers;
    a row decoder operatively connected to said first group of address buffers and having outputs;
    word lines operatively connected to the outputs of said row decoder;
    a second group of address buffers;
    a column decoder operatively connected to said second group of address buffers and having outputs;
    column decoder output lines connected to the outputs of said column decoder;
    power down means, operatively connected to said first and second groups of address buffers, for placing said first and second group of said address buffers in a power down mode by applying a power down mode signal thereto;
    bit lines which are selected in dependence upon the output of said column decoder output lines;
    bit line selection means, operatively connected between said column decoder output lines and said bit lines, for selecting said bit lines in dependence upon the output of said column decoder output lines;
    a memory array of cell transistors which are operatively connected at the cross points of said word lines and said bit lines and each memory array cell transistor has a source connected to ground, a control gate connected to one of said word lines, a drain connected to one of said bit lines and a floating region for storing electric charge, information "0" is written in the respective cell transistor by placing the respective selected word line and the respective selected bit line at a first potential at the same time, information "1" is written in the respective cell transistor by placing the respective selected word line at the first potential and the respective selected bit line at a second potential; and at least one control circuit, operatively connected to said first group of address buffers, said second group of address buffers and said power down means, for placing, at a test time, a plurality of said word lines and/or a plurality of said bit lines in a selected state at the same time.

3. An electrically programmable non-volatile semiconductor memory device according to claim 2, wherein said first group of address buffers includes a first address buffer and a third address buffer and said second group of address buffers includes a second address buffer, and wherein said at least one control circuit comprises three control circuits including:
  a first control circuit, which, in the test time, places part of said word lines at the selected state at the same time and is operatively connected to the first address buffer included in said first group of said address buffers;
  a second control circuit, which, in the test time, places all of said bit lines at the selected state at the same time and is operatively connected to the second address buffer included in said second group of said address buffers; and
  a third control circuit, which, in the test time, places the remainder of said word lines at the non-selected state at the same time and is operatively connected to a third address buffer included in said first group of said address buffers.

4. An electrically programmable non-volatile semiconductor memory device according to claim 3, wherein said first control circuit comprises:
  a first inverter, operatively connected to said first address buffer, which has an output and receives the same input as said first address buffer;
  a second inverter, operatively connected to the output of said first inverter and said power down means, which has an output and is controlled in dependence upon either the output of said first inverter or said power down mode signal; and
  a third inverter, operatively connected to the output of said second inverter and to said first address buffer, which controls said first address buffer in dependence upon the output of said second inverter, so that said first address buffer places all of said word lines of said row decoder in the selected state in dependence upon the output of said third inverter;

wherein said second control circuit comprises:
  a fourth inverter, operatively connected to said second address buffer, which has an output and receives the same input as said second address buffer;
  a fifth inverter, operatively connected to the output of said fourth inverter and said power down means, which has an output and is controlled in dependence upon either the output of said fourth inverter or said power down mode signal; and
  a sixth inverter, operatively connected to the output of said second inverter and to said second address buffer, which controls said second address buffer in dependence upon the output of said fifth inverter, so that said second address buffer places all of said bit lines of said column decoder in the selected state in dependence upon the output of said sixth inverter; and wherein said third control circuit comprises:
  a seventh inverter, operatively connected to said third address buffer, which has an output and receives the same input as said third address buffer;
  an eighth inverter, operatively connected to the output of said seventh inverter and said power down means, which is controlled in dependence upon either the output of said seventh inverter or said power down mode signal; and
  a ninth inverter, operatively connected to the output of said eighth inverter and said third address buffer, which controls said third address buffer in dependence upon the output of said eighth inverter, so that said third address buffer places all of said word lines of said row decoder in the non-selected state in dependence upon the output of said ninth inverter.

5. An electrically programmable non-volatile semiconductor memory device according to claim 1, wherein said bit lines are divided into N bit line groups, each group containing M bit lines, wherein said memory device further comprises:
  N first column selecting gates being disposed to correspond to the respective bit line groups; and
  M second column selecting gates being disposed in each bit line group to correspond to the respective bit lines and each being operatively connected to the respective bit line and to the respective one of said N first column selecting gates, wherein said decoder comprises:
  a first column decoder operatively connected to said N first column selecting gates and having inputs; and
  a second column decoder, operatively connected to said M second column selecting gates of each of said N bit line groups, said first column decoder selecting said N first column selecting gates individually or simultaneously in dependence upon the output of said first column decoder, said second column decoder selecting one second column selecting gate in each bit line group so that N second column selecting gates as a whole can be selected simultaneously;

wherein said memory device further comprises address buffers operatively connected to the inputs of said first column decoder, and wherein said at least one control circuit is operatively connected to one of said address buffers connected to one of the inputs of said first column decoder, so that said at least one control circuit is disposed to simultaneously select said N first column selecting gates through said first column decoder at the test time when the information "0" is written in all the cells.

6. An electrically programmable non-volatile semiconductor memory device according to claim 5, wherein said power down means being operatively connected to said control circuit, and for generating a power down mode signal, and wherein said at least one control circuit comprises:
  a first inverter, operatively connected to the one of said address buffers, which has an output and receives the same input as the one of said address buffers;
  a second inverter, operatively connected to the output of said first inverter and said power down means, which has an output and is controlled in dependence upon either the output of said first inverter or said power down mode signal; and a third inverter, operatively connected to the output of said second inverter and the one of said address buffers, which selects the N first column selecting gates at the same time in dependence upon the output of said second inverter.

7. An electrically programmable non-volatile semiconductor memory device, comprising:

a memory cell array having memory cells with word and bit lines;

an input circuit, operatively connected to the bit lines in said memory cell array, for applying a write signal to all memory cells and having active and inactive states;

a decoder operatively connected to the word and bit lines of said memory cell array and including an address buffer;

control means, operatively connected to said address buffer, for simultaneously placing the word and/or bit lines of said memory cell array in a selected state and placing said input circuit in the active state; and powder down means, operatively connected to said decoder and said input circuit, for placing said decoder and said input circuit in a power down mode at a power down time, and in said power down mode all of said word lines and/or all of said bit lines being in a selected state at the same time and said input circuit being in the inactive state.

8. An electrically programmable non-volatile semiconductor memory device operatively connected to receive a power down signal at a power down time and an address signal, said device comprising:

a memory cell array having memory cells and bit and word lines connected thereto;

a decoder operatively connected to the bit and word lines of said memory cell array;

an address buffer operatively connected to said decoder and operatively connected to receive the address signal;

control means, operatively connected to said address buffer and to receive a test signal, for simultaneously placing the memory cells of said memory cell array in a selected state, said control means supplying a control signal to said address buffer when receiving the address signal at a test time or when receiving the power down signal at the power down time so that the decoder selects all of the word lines and/or all of the bit lines, and said control means comprising:

a first inverter operatively connected to receive the address signal;

a second inverter operatively connected to said first inverter and to receive the power down signal; and a third inverter operatively connected to said second inverter and said address buffer.

9. An electronically programmable non-volatile semiconductor memory device according to claim 8, wherein said first inverter comprises:

a first transistor operatively connected to said second inverter; and a second transistor operatively connected to said first transistor, said second inverter and to receive the address signal.

10. An electrically programmable non-volatile semiconductor memory device according to claim 8, wherein said second inverter comprises:

a first transistor operatively connected to said third inverter; and a second transistor operatively connected to said first transistor, said third inverter and to receive the power down signal; and a third transistor operatively connected to said first inverter and said second transistors.

11. An electrically programmable non-volatile semiconductor memory device according to claim 8, wherein said third inverter comprises:

a first transistor operatively connected to said address buffer; and a second transistor operatively connected to said second inverter, said first transistor and said address buffer.

* * * * *

UNITED STATES PATENT AND TRADEMARK OFFICE
CERTIFICATE OF CORRECTION

PATENT NO. : 4,543,647

DATED : September 24, 1985

INVENTOR(S) : MASANOBU YOSHIDA

It is certified that error appears in the above-identified patent and that said Letters Patent is hereby corrected as shown below:

* Col. 11, line 65, "programable" should be --programmable--.

Col. 15, line 26, "powder" should be --power--.

Signed and Sealed this

Eighteenth Day of March 1986

[SEAL]

Attest:

DONALD J. QUIGG

Attesting Officer

Commissioner of Patents and Trademarks